United States Patent [19]
Calomiris

[11] 4,301,419
[45] Nov. 17, 1981

[54] PARASITIC CAPACITANCE COMPENSATION IN CMOS-SWITCHED ACTIVE FILTER

[75] Inventor: Thomas J. Calomiris, Beltsville, Md.

[73] Assignee: The United States of America as represented by the Secretary of the Army, Washington, D.C.

[21] Appl. No.: 121,181

[22] Filed: Feb. 13, 1980

[51] Int. Cl.³ .............................................. H03F 1/34
[52] U.S. Cl. .................................... 330/107; 330/109
[58] Field of Search ......................... 330/51, 107, 109

[56] References Cited
U.S. PATENT DOCUMENTS
3,715,678  2/1973  Reichard ............................. 330/107

*Primary Examiner*—James B. Mullins
*Assistant Examiner*—Gene Wan
*Attorney, Agent, or Firm*—Nathan Edelberg; Robert P. Gibson; Saul Elbaum

[57] ABSTRACT

Method and apparatus for compensation of switched resistance active filters to maintain a relatively constant Q and voltage gain by switching additional resistors in and out of the filter circuit. Solid state circuitry provides signals for activating switches to switch the compensating resistances as the operating frequency of the filter is altered. Compensation depends essentially on the number of open switches in the frequency selecting resistance array rather than on frequency of operation. An approximate approach reduces the number of resistances and switches needed for compensation, yet provides minimal error.

7 Claims, 4 Drawing Figures

PARASITIC CAPACITANCE COMPENSATION IN CMOS-SWITCHED ACTIVE FILTER

RIGHTS OF THE GOVERNMENT

The invention described herein may be manufactured, used, and licensed by or for the U.S. Government for governmental purposes without the payment to me of any royalty thereon.

BACKGROUND OF THE INVENTION

1. Field of the Invention

This invention relates to active filters, and more particularly to the compensation of active filters utilizing switched resistances for frequency variation in order to maintain relatively constant the Q and voltage gain of the circuit with variations in operating frequency.

2. Prior Art

The use of active filters in order to provide precision tuning of operating circuits is known in the prior art. In such filters tuning is typically accomplished by the control of voltage-variable impedances, by duty cycle switching of resistances, or by switching of parallel or series connections of resistance combinations.

Tuning by control of voltage-variable impedances, however, is susceptible to errors caused by extreme variations in tuning elements between units, as well as by variations in element characteristics with temperature and other environmental parameters. Tuning by variation of the repetition rate of filter elements inserted and withdrawn from the circuit is impractical for operation at high frequency.

For parallel resistance switching, large errors in Q and voltage gain occur for higher frequency filter designs, for which capacitance must be reduced.

SUMMARY AND OBJECTS OF THE INVENTION

It is accordingly an object of the present invention to overcome the difficulties of the prior art by providing a compensating circuit to reduce variations in circuit parameters, such as circuit Q or voltage gain, for example, with change in operating frequency.

It is a more specific object of the invention to provide a number of switchable resistors for use in a switched resistance active filter, the compensating resistors being switched in and out of the circuit to compensate for the opening and closing of switches required in order to tune the filter.

Still another object of the invention is the provision of digital circuitry for switching the compensating resistances in and out of the active filter circuit.

It is yet another object of the invention to provide a method for selecting the compensating resistances to be used in minimizing variations of circuit parameters in an active filter.

In accordance with the invention, compensating impedances, more specifically compensating resistances, are provided at one input to an operational amplifier used in an active filter. The compensation resistors may be connected in series or in parallel, and are bypassed by controllable switches.

In accordance with another feature of the invention, a control circuit generates signals for controlling the activation of switches used to switch the frequency selection resistances of the active filter. The signals used to activate the switches for the resistance matrix are provided to a second control circuit which, in turn, produces signals for activating the compensation switches.

An algorithm is disclosed for calculating the values for the compensation resistors used in the present invention.

BRIEF DESCRIPTION OF THE DRAWING

The foregoing and other objects, features and advantages of the present invention will become more apparent from the following specification and appended claims when considered in conjunction with the attached drawing wherein:

DETAILED DESCRIPTION OF A PREFERRED EMBODIMENT

Figure 1:
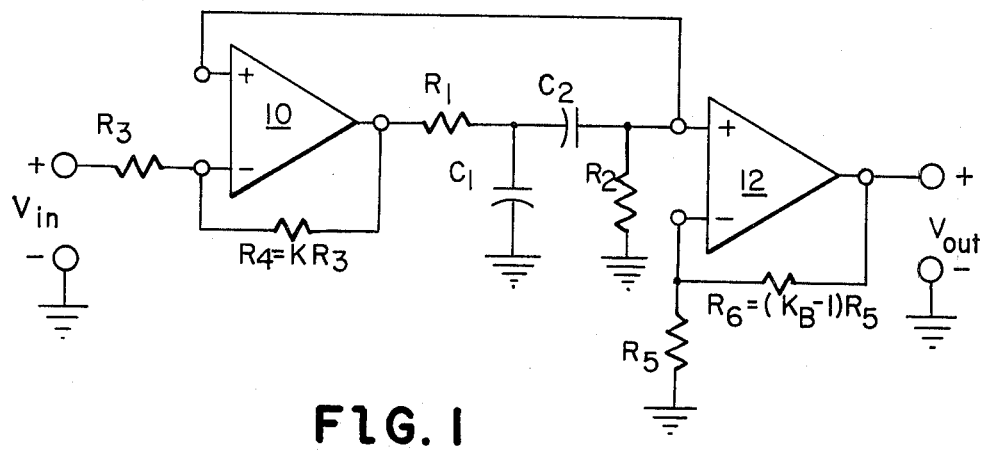
FIG. 1 illustrates a known active bandpass filter structure.

In carrying out the objectives of the present invention, a basic active bandpass filter structure of the prior art, shown in FIG. 1, is modified to provide substantially constant circuit parameters independently of the circuit of operation. As is known in the art, the filter of FIG. 1 operates at a center frequency $w_o$ substantially given by the equation $$w_o = 1/RC, \text{ when } R_1 = R_2 = R, C_1 = C_2 = C \tag{1}$$

with a circuit quality, or Q parameter determined by $$Q = w_o/(w_2 - w_1) = 1/(2-K), \tag{2}$$

where $w_2$ and $w_1$ are the upper and lower 3db frequencies and where K is the ratio of $R_4$ to $R_3$. Similarly, the voltage gain of the active filter is given by $$A_V = -K_B(2Q-1) = -K_B K/(2-K) \tag{3}$$

where the constant $K_B$ is determined by $$K_B = (R_6 + R_5)/R_5. \tag{4}$$

Figure 2:
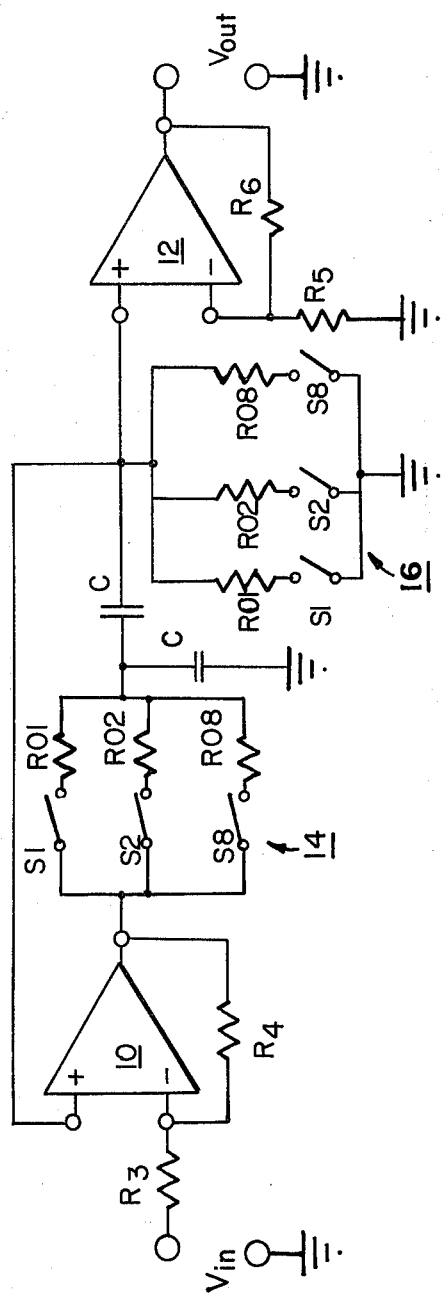
FIG. 2 shows a modification in the circuit of FIG. 1 to enable tunable operation of the same.

Active filters of the type shown in FIG. 1 may be made to operate at various frequencies by changing $R_1$ and $R_2$, in accordance with Eq. 1. A circuit wherein various resistance values may be substituted for $R_1$ and $R_2$ of FIG. 1 is shown in FIG. 2, where resistors R01 through R08 are shown as switchably connected in place of $R_1$ and $R_2$. Of course, any number of resistors may be switched in and out of the circuit, the number eight being chosen as a convenient value, enabling the circuit to be tuned to any of $2^8 - 1 = 255$ possible center frequencies. Further, the resistors may be connected in series, with shunting switches, rather than in parallel, with series switches, as shown in the Figure. The circuit is tuned to a specific operating frequency by closing a particular combination of switches in the resistance tuning matrix replacing $R_1$, and by closing the same combination of switches in the tuning matrix replacing $R_2$. Closure of different combinations of switches will not result in the simplified frequency determination given by Eq. 1.

Figure 3:
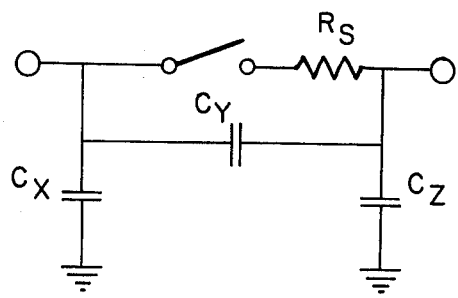
FIG. 3 is an equivalent circuit of a switch used in FIG. 2.

In a typcial circuit providing the features of FIG. 2, the switches are provided by IC chips containing a plurality of CMOS switch cells and associated drive circuitry. Use of such switches, however, introduces stray capacitances previously neglected in the description of circuit operation. The parasitic capacitances associated with each switch are shown in FIG. 3, where an equivalent circuit for the switch is shown. Specifically, each switch is known to have a switching resistance Rs, an input capacitance Cx, a shunting capacitance Cy, and an output capacitance Cz. In operation, the switched resistances (R01–R08) are chosen to be much larger than Rs, and the operating capacitances C are chosen to be as large as possible in order to reduce the error caused by the parasitic capacitances. For example, R01 may be chosen much larger than Rs and the remaining resistances determined by the equation $$R_{0J} = 2^{J-1}(R_{01} + R_s) - R_s \quad (5)$$

in order to provide binary selection of any multiple of R01. Such selection permits calculations of parasitic impedances to neglect the switching resistance, and to assume the parasitic impedances to be capacitive.

Figure 4:
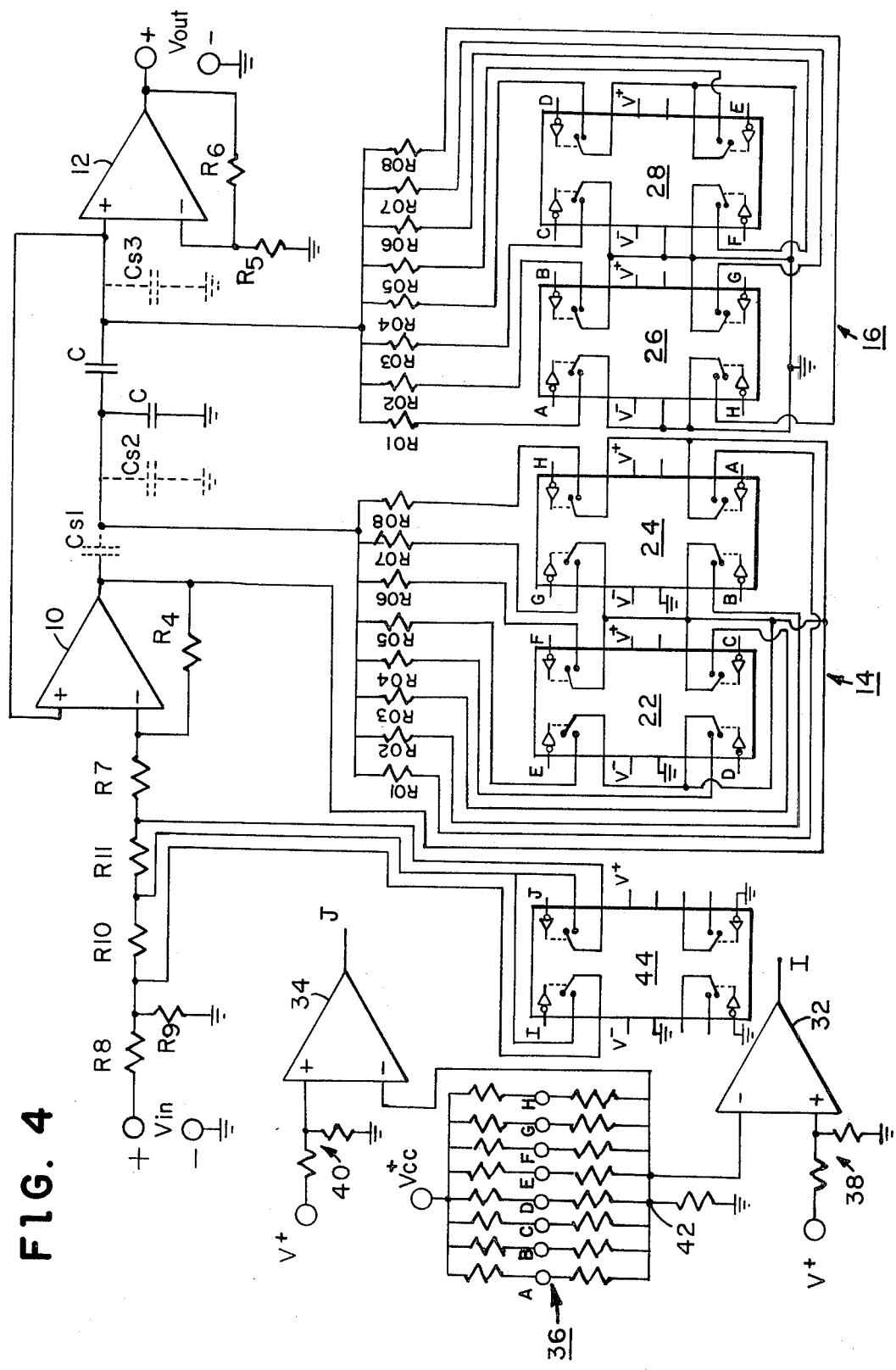
FIG. 4 shows the improvement of the present invention used in the structure of FIG. 3.

FIG. 4 shows an actual circuit for realizing the filter of FIG. 2, and includes therein parasitic switch capacitances Cs1, Cs2 and Cs3. Using the switch model of FIG. 3 and assuming a condition wherein any n switches are open, the switch capacitances are given by the equations $$Cs1 = nCy; \; Cs2 = nCz; \; \text{and} \; Cs3 = n(Cy + Cz). \quad (6)$$

Parasitic capacitance nCx presented directly across operational amplifier 10 may be neglected because the amplifier's negative feedback, in conjunction with operational amplifier open loop characteristics, results in an extremely low output impedance. The presence of the parasitic capacitances degrades circuit performance, by reducing the voltage gain Av and by reducing the Q factor.

The present invention overcomes the degradation of circuit performance resulting from parasitic capacitances by use of the novel circuit shown in FIG. 4, wherein the ratio K is increased with an increasing number of open switches in the tuning matrix. The circuit specifically provides a matrix of compensating resistances switchable in and out of the circuit in order to alter the ratio K as the number of tuning resistance switches in the circuit changes. It is recognized, however, that while compensation matrix 20 is shown as a series connection of resistors operation could also take place with a parallel, or with a series-parallel matrix of compensating impedances. Moreover, while FIG. 4 shows the compensation matrix as varying the resistance of the input resistance, shown as R3 in FIG. 2, compensation may similarly be achieved with a matrix connected to vary the feedback resistance, shown as R4 in FIG. 2. Nonetheless, the preferred embodiment utilizes a matrix of series connected compensating resistors, selectively shunted by closure of controlled switches, in series with the negative input resistance for the input operational amplifier.

The basic active bandpass filter structure shown in FIG. 1 includes a first operational amplifier 10, receiving an input voltage Vin through resistor R3 connected to the negative input thereof. A resistor R4 provides a feedback connection from the output of amplifier 10 to its negative input. The output of amplifier 10 is connected to a resistor R1, whose other terminal is connected to a juncture between capacitors C1 and C2. C1 is grounded at its other terminal, while the second terminal of C2 is connected to resistor R2, to the positive input of a second operational amplifier 12, and to a feedback loop to the positive input of amplifier 10. Resistor R2 is connected, at its other terminal, to ground. The negative input to amplifier 12 is grounded through resistor R5, and also receives a feedback connection from its output via R6, having a resistance given by $$R_6 = (K_B - 1)R_5. \quad (7)$$

The filter output voltage is taken between the output of amplifier 12 and ground, while the filter input is provided between the negative input terminal of amplifier 10 (through resistor R3) and ground. The frequency transfer function of the filter of FIG. 1 is known to simulate that of a standard single tuned circuit, given by $$A_v(s) = K_o \frac{w_o s/Q}{s^2 + w_o s/Q + w_o^2}. \quad (8)$$

In the circuit of FIG. 2, the filter of FIG. 1 is modified to be tunable to operate at various frequencies as has previously been disclosed. The modification essentially provides tuning matrices 14 and 16 instead of resistances R1 and R2 in FIG. 1. In the preferred embodiment of FIG. 2, the two matrices include identical parallel combinations of resistances R01, R02, ... R08, each resistance in series with a switching element. As previously discussed with respect to the compensation matrix, the tuning matrices 14 and 16 may be comprised of any series or parallel connection of tuning impedances, the resistive elements having been chosen for convenience. The switching elements S1, S2, ... S8 may be any element capable of interrupting an electrical connection, and may include manually actuated mechanical elements, vacuum tube or solid state controlled switches. Typically, CMOS switches are utilized, each such switch having an equivalent circuit as shown in FIG. 3. In order to maintain the particularly simple relationship between circuit elements and operating frequency disclosed in Eq. (1), the matrices 14 and 16 are identical, and closure of a particular switch, Sj, in one matrix is accompanied by closure of the corresponding switch, Sj, in the other matrix.

Referring now to FIG. 4, the actual components used for matrices 14 and 16 are seen to include a number of CMOS analogue switches on separate chips 22, 24, 26 and 28. Such chips are available from Harris Semiconductor under the designation HI 201, as quad CMOS analog switches, for example. Each controlled CMOS switch is seen to be responsive to a signal, labelled A through H. Chips 22 and 24 control the resistances in tuning matrix 14, and chips 26 and 28 control the resistances in tuning matrix 16. As is apparent from the diagram, the switches for corresponding resistors in the matrices are controlled by the same signal. Thus, signal E is used to control R05 in both matrices, for example. The signals A through H are obtained from a control input, which may be manually set switches, a ROM, a computer output, or a shift register, for example. One shift register usable in the present invention is available from RCA under the designation CD4034B, not shown in the figures.

The thrust of the present invention is to overcome the variation in important circuit parameters, such as Q or voltage gain, for example, caused by changes in parasitic capacitances occasioned by changes in the number of open and closed switches in matrices 14 and 16. From Eq. (2), supra, it is seen that Q is dependent on the value of K, the ratio of the feedback resistor $R_4$ to the input resistance connected to the inverting input of amplifier 10. As shown in FIG. 4, the single input resistor $R_3$ is replaced by a compensation matrix wherein impedances, specifically resistances, may be inserted and removed from the input connection, thus raising and lowering the value of the effective input resistance and lowering and raising the value of K. The insertion and deletion of resistors may be done manually. However, in view of the availability of control signals indicative of opening and closing of switches in matrices 14 and 16, the filter of FIG. 4 provides a plurality of comparators to respond to the opening of specific numbers of switches in matrices 14 and 16 by generating signals used to insert and delete resistance from the input circuit. Ideally, where m switches are used in each matrix 14 and 16, m-1 resistances should be switchable in the input circuit. As is shown later, however, where the number of open switches may vary from 1 to 7, correction may be achieved by the use of only two switched compensating resistances. Accordingly, the circuit of FIG. 4 includes two comparators, 32 and 34, receiving one input from a resistive matrix 36 and a second input from voltage dividers 38, 40. The CMOS switches of matrices 14 and 16 open for a high level control voltage. Accordingly, the greater the number of open switches, the higher the voltage at point 42. Voltage divider 38 may be selected to provide an input voltage to comparator 32 equivalent to the voltage observed at point 42 when three switches are open in matrices 14 and 16. Voltage divider 40 may be chosen to provide an input voltage to comparator 34 equivalent to six switches being open. Thus, as more switches are opened in the tuning matrices the voltage at point 42 increases until, when three switches are open, comparator 32 provides a low level output. When six switches are open, comparator 34 is also caused to output a low level voltage. A further CMOS chip 44 receives the output signals, I and J, from the comparators, and causes associated resistors R10 and R11 to be shorted, sequentially, as first three and then six switches are opened in the tuning matrices. Such shorting increases K stepwise, responsive to opening of switches in the tuning matrix, and accordingly increases both Q and $A_v$, as seen in Eqs. 2 and 3.

As is apparent from the preceding discussion, it is the number of open switches, and not the operating frequency, which determines the amount of parasitic capacitance in the circuit and the degradation of performance. The present improvement provides compensation for such degradation substantially simultaneously with the offending switch openings. Such compensation can correct large variations in Q and/or $A_v$, approximating 30% to 50%, for example. However, the above described compensation cannot simultaneously compensate for both Q and $A_v$. Fortunately, for typical values of Q, say Q greater than 1, compensation for Q results in similar compensation for $A_v$, leaving but a small percentage error in the gain figure, on the order of 1% to 5% or less. Similarly, where resistance values of the compensating resistors are chosen to compensate for $A_v$, the resultant percentage error in Q is similarly small.

The comparators used to determine the number of open switches and to generate compensation matrix switching signals may typically be obtained as quad op-amps HA 4605 from Harris Semiconductor. Operational amplifier 10, used in the filter circuit, may be obtained as an RCA op-amp TA 10272, while amplifier 12 may be obtained from National Semiconductor as op-amp LM 318.

In operation, a particular code word may be stored in a memory (not shown), and recalled for a particular center frequency. The code word, obtained from a shift register, for example, includes a sequence of high and low voltage levels, representing logic "one's" and "zero's" applied to terminals A, B, C, D, E, F, G and H. Those terminals in chips 22, 24, 26 and 28 receiving a high level (logic 1) voltage cause the switch associated therewith to open. Of course, switches may be used which close for a high input voltage, with minor modification of the circuit which would be apparent to one skilled in the art. The control voltages A through H are also applied to the matrix 36 at the indicated terminals. Matrix 36 includes a set of pull-up resistors to maintain a known, accurate voltage at the junction 42, by connection to the supply voltage. The matrix 36 thus provides a set of voltage dividers outputting an accurate voltage at point 42, indicative of the number of open switches in matrices 14 and 16.

To determine the values of the compensating resistances to be used the following approximate, but very accurate approach may be used.

Let it be assumed that compensation is provided by a series connection of n identical resistors, Rc1, Rc2, ... Rcn. Let it further be assumed that the value of K necessary to bring the desired parameter (Q or Av) to its zero-open switch level whem m switches are open is Kn. Further, let each switch be represented by a series connection of a switch and a switch resistance Rs, and let the total compensating resistance be $$Rc = Rc1 + Rc2 + Rc3 + \ldots + Rcn. \tag{9}$$

With R7 being a fixed resistance at the input of op-amp 10, it is seen that, with m open switches in the tuning matrix, and a required K factor of Kn (determined in the sequel) for compensation, if $Rc1 = Rc2 = \ldots Rci$, then $$R_4/Kn = R7 + n\frac{Rci\, Rs}{Rci + Rs} \quad i = 1, \ldots n \tag{10}$$

However, by definition, with no tuning matrix switches open, $$R_4/K = R7 + nRci \quad i = 1, \ldots n \tag{11}$$

It is found that, by subtracting equation 10 from equation 11, the amount of resistance switched in and out of the compensation matrix by activation/deactivation of one compensating switch is $$r = Rci - \frac{Rci\, Rs}{Rci + Rs} = R_4(1 - K/K_n)/n\, K \tag{12}$$

and that the resulting quadratic equation $$Rci^2 - r\, Rci - Rs\, r = 0 \tag{13}$$

has a solution $$Rci = \tfrac{1}{2}r(1+\sqrt{1+4Rs/r}) \tag{14}$$

where r is obtained as a function of n from Eq. 12. Ideally, n (the number of compensating resistors) should equal m (the maximal number of open tuning matrix switches). As shown in the following table, however, for the embodiment shown in FIG. 4 where only two compensating resistors are used for tuning matrices of eight switched resistances each the error in compensation never exceeds the equivalent of one open switch. As previously discussed, the comparators 32 and 34 are provided with voltage dividers 38 and 40 designed to cause comparator 32 to output a low level voltage (logic 0) when two switches or more have been opened in the tuning matrix 14 or 16, while comparator 34 outputs a logic 0 once five or more switches have been opened in one of the tuning matrices. In using the results of Eq. 13, it is seen that each resistor, R10 and R11 of FIG. 4 compensates for three open tuning matrix switches. The following table then illustrates that for any given circumstance, there is at most one open switch left uncompensated.

TABLE I

| Number of Open Switches | 0 | 1 | 2 | 3 | 4 | 5 | 6 | 7 |
|---|---|---|---|---|---|---|---|---|
| Number of Open Switches Compensated for | 0 | 0 | 3 | 3 | 3 | 6 | 6 | 6 |
| Number of Open Switches left Uncompensated | 0 | 1 | −1 | 0 | 1 | −1 | 0 | 1 |

To provide the ideal solution, two CMOS switch chips would be used, along with two quad op-amp chips, and seven compensating resistors. Each op-amp would be set to provide a logic 0 output for a different number of open tuning matrix switches (1 through 7), and the respective outputs would drive one of seven of the eight CMOS switches to short one of seven compensating resistors, with values obtained by solving Equation 14 for the appropriate value of n (i.e., 7).

To determine the value of Kn to be used in Equations 10–12, the following procedure is followed. The procedure further includes steps for obtaining the exact solutions for the compensating resistances.

I. Preliminary Design
1. Given maximum desired Wo (Womax) and minimum tolerable value of R01, calculate $$C = \sum_{j=1}^{8} 2^{-j+1}(Wo(RO1 + Rs))^{-1}.$$

2. For given Q, calculate $K = (2Q-1)/Q$.
3. Calculate
   $Cs1(n) = nCy$;
   $Cs2(n) = nCz$;
   $Cs3(n) = n(Cy + Cz)$,
   for condition of perfect compensation, i.e. for $n=3$ and 6 for the circuit of FIG. 4.

II. Q Compensation
   Let
   $a1n = (Cs1(n) + Cs2(n) + Cs3(n))/C$.
   $a2n = (Cs2(n) + 2Cs3(n))/C + Cs3(n)(Cs1(n) + Cs2(-n))/C^2$,
   $a3n = Cs1(n)/C$,
   $b1n = 2(2+a1n) + a3n/Q^2$,
   $b2n = (2+a1n)^2 - (1+a2n)/Q^2$,
   $K_n' = (b1n/2)(-1+\sqrt{1-4b2n/b1n^2})$, $n=3, 6$.
   $K_n'$ is the value of K for n open CMOS switches to compensate for Q degradation.

III. $A_v(Wo)$ Compensation
   Let
   $Con = (2Q-1)^2(2+a1n)^2$,
   $C1n = 2(2Q-1)^2(2+a1N)/a3n$,
   $C_{2n} = ((2Q-1)^2 - a2n-1)/a3n$,
   $Pn(Kn'') = Kn''^3 + C2nKn''^2 + C1nKn'' - C0n = 0$,
   $n=3, 6$.
   $Kn''$, the value of K for n open CMOS switches to compensate for $A_v$ degradation, is the solution of the above cubic equation.

IV. Circuit Components Calculations
   Let Kn be the value of Kn' (Q compensation) or Kn" ($A_v$ compensation), and:
   1. Choose R4 such that R4/K is much greater that Rs (typically, R4/K exceeding 150 Rs).
   2. Let $Rx = (R4/K)(1 - K/K3)$.
      then $R10 = \tfrac{1}{2}Rx(1+\sqrt{1+4Rs/Rx})$.
   3. Let $Ry = (R4/K)(1 - K/K6) - R10^2/(Rs+R10)$,
      then $R11 = \tfrac{1}{2}Ry(1+\sqrt{1+4Rs/Ry})$.
   4. (a) Determine the maximum peak voltage swing $V_{Nmax}$ at the noninverting input of op-amp 12 in FIG. 4.
      (b) Determine the maximum peak voltage swing $V_{smax}$ of the voltage source encountered under no load conditions.
      (c) If $(2Q-1)V_{smax} > V_{Nmax}$, then the attenuator network R8-R9 of FIG. 4 is necessary, and, using Rvs for the voltage source output resistance,
      $K_A = R9/(R8+Rvs+R9) = V_{Nmax}/((2Q-1)V_{smax})$.
      (d) Let $Rz = R4/K - (R10+R11)$, then
      $R7 = Rz - (R8+Rvs)R9/(R8+R9+Rvs)$.
      (e) If the desired overall gain is G, then $R6 = GK_A/(2Q-1) - 1$ R5. If $R6<0$, then $K_A$ may be chosen such that $R6=0$ and R5 is removed from the network.

V. Error Computation
   Assuming precise compensation for exactly n open CMOS switches, the following errors in Av(Wo), Wo (Q compensation) or in Q, Wo (Av(Wo) compensation) result.
   1. Q compensation
      $Av(Wo')/Av(Wo) = Kn'/K$,
      $Wo'/Wo = 1\sqrt{1+a2n-a3n\,Kn'}$ 2. Av(Wo) compensation
      $Q''/Q = \sqrt{1+a2n-a3n\,Kn''}/((2-Kn''+a1n)Q)$,
      $Wo''/Wo = 1\sqrt{1+a2n-a3nKn''}$.

While the preceding algorithm results in two compensating resistor values, the exact solution for seven compensation resistances requires the solution of seven simultaneous equations. This result, however, can be approximated, as previously discussed, by assuming that each of the seven resistances will be the same. Thus, the amount of error introduced by seven open switches is calculated to provide a single needed compensating resistor, and the resistance divided by seven. Minor experimentation, or tweaking of the results will provide an excellent approximation to the exact solution.

The preceding specification discloses a method and apparatus for overcoming problems introduced by parasitics in an active filter which cause a reduction in Q and in circuit gain, and an increase in the passband. The approach herein provided compensates for parasitic capacitances by automatically increasing a ration, K, in the filter by a slight reduction of the input resistance with opening of tuning matrix switches.

I wish it to be understood that I do not desire to be limited to the exact details of construction shown and described, for obvious modifications can be made by a person skilled in the art.

I claim:

1. In an active filter circuit comprising at least one operational amplifier, a tuning matrix of impedance elements connected to said operational amplifier for tuning said filter to operate at various frequencies and a first switching means for switching various ones of said impedance elements in and out of the filter circuit, the improvement comprising:
   a compensation matrix comprising at least one compensation impedance means connected to an input of said operational amplifier;
   a second switching means comprising at least one controllable switch shunting at least one of said compensation impedance means, said second switching means connected to said compensation matrix for switching various ones of said compensating impedance means in and out of the filter circuit; and
   comparator means for controlling said controllable switches;
   whereby said active filter circuit is provided with relatively stable values of circuit parameters as said filter is tuned to different frequencies by said tuning matrix.

2. An active filter, as recited in claim 1, wherein said compensation matrix is connected for responding to signals controlling said first switching means.

3. An active filter, as recited in claim 2,
   wherein said compensating impedance means comprises a plurality of at least K series connected compensating resistances, wherein K represents some number; and
   wherein at least K−1 of said compensating resistances are ech shunted by one of said controllable switches.

4. An active filter, as recited in claim 3, wherein said compensation matrix is connected for responding to signals controlling said first switching means.

5. An active filter, as recited in claim 4, wherein said operational amplifier is connected to an input circuit of said filter circuit and wherein said compensation matrix is connected to an input of said operational amplifier.

6. In an active filter circuit having predetermined circuit Q and voltage gain characteristics, compensating means for maintaining said Q and voltage gain characteristics substantially at said predetermined values as said active filter is caused to operate at different frequencies, said compensating means comprising:
   a plurality of compensating resistors;
   a plurality of switching means connected to said compensating resistors; and
   means for controlling said switching means for inserting and removing various ones of said compensating resistors into and out of the filter circuit, wherein said means for controlling said switching means includes means responsive to signals activating said tuning control means; and
   wherein said active filter circuit comprises a plurality of switchable tuning impedances and tuning control means for switching said tuning impedances in and out of circuit;
   whereby compensation for the condition of said tuning control means is provided to said active filter circuit substantially simultaneously with the provision of signals to said tuning control means for switching said tuning impedances.

7. An active filter, as recited in claim 6, wherein said compensating resistors are series connected, each shunted by one of said switching means.

* * * * *